United States Patent
Sung et al.

(10) Patent No.: US 9,691,664 B1
(45) Date of Patent: Jun. 27, 2017

(54) DUAL THICK EG OXIDE INTEGRATION UNDER AGGRESSIVE SG FIN PITCH

(71) Applicant: GLOBALFOUNDRIES Inc., Grand Cayman (KY)

(72) Inventors: Min Gyu Sung, Latham, NY (US); Chanro Park, Clifton Park, NY (US); Hoon Kim, Halfmoon, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/170,126

(22) Filed: Jun. 1, 2016

(51) Int. Cl.
| | |
|---|---|
| *H01L 21/00* | (2006.01) |
| *H01L 21/84* | (2006.01) |
| *H01L 21/8234* | (2006.01) |
| *H01L 21/02* | (2006.01) |
| *H01L 21/311* | (2006.01) |
| *H01L 27/088* | (2006.01) |

(Continued)

(52) U.S. Cl.
CPC .. *H01L 21/823431* (2013.01); *H01L 21/0214* (2013.01); *H01L 21/02164* (2013.01); *H01L 21/02238* (2013.01); *H01L 21/31111* (2013.01); *H01L 21/823462* (2013.01); *H01L 21/845* (2013.01); *H01L 27/0886* (2013.01); *H01L 29/42364* (2013.01); *H01L 29/66545* (2013.01); *H01L 29/66795* (2013.01)

(58) Field of Classification Search
CPC ..... H01L 21/823431; H01L 21/823462; H01L 21/845; H01L 21/0214; H01L 21/31111; H01L 21/02164; H01L 21/02238; H01L 29/66795; H01L 29/66545; H01L 29/42364
See application file for complete search history.

(56) References Cited

U.S. PATENT DOCUMENTS

| | | | |
|---|---|---|---|
| 2009/0148986 A1* | 6/2009 | Cheng | H01L 27/1211 438/157 |
| 2014/0001575 A1* | 1/2014 | Adams | H01L 21/845 257/412 |
| 2014/0117447 A1* | 5/2014 | Basker | H01L 29/66795 257/347 |

OTHER PUBLICATIONS

Yokota et al. "Enabling single-wafer low temperature radical oxidation", Published in 2005, 13th IEE International conference on Advanced Thermal Processing of Semiconductors—RTP 2005, Santa Barbara, CA, p. 139-143, 5 Pages.

(Continued)

*Primary Examiner* — Jesse Y Miyoshi
(74) *Attorney, Agent, or Firm* — Ditthavong & Steiner, P.C.

(57) ABSTRACT

A method of forming a thick oxide layer over fins for EG devices and a thinner oxide layer over fins for SG devices on the same substrate and the resulting device are provided. Embodiments include forming a first set of fins over a first portion of a Si substrate; forming a second set of fins over a second portion of the Si substrate spaced from the first portion; forming an iRAD $SiO_2$ layer over the first and second sets of fins; forming a polysilicon layer over the iRAD $SiO_2$ layer over the first set of fins; forming a radical $SiO_2$ layer over the iRAD $SiO_2$ layer over the second set of fins and over the polysilicon layer; forming a mask over the radical $SiO_2$ layer over the second set of fins; removing the polysilicon layer; and removing the mask and the iRAD $SiO_2$ layer from the first set of fins.

17 Claims, 16 Drawing Sheets

(51) Int. Cl.
*H01L 29/66* (2006.01)
*H01L 29/423* (2006.01)

(56) References Cited

OTHER PUBLICATIONS

Cho et al, "Reliability of Recess-channel Gate Cell Transistor under Gate-Induced Drain Leakage Stress and Positive Bias Fowler-Nordheim Gate Stress", Published in 2006 European Solid-State Device Research Conference, IEEE, Montreux, p. 415-418, 4 Pages.

* cited by examiner

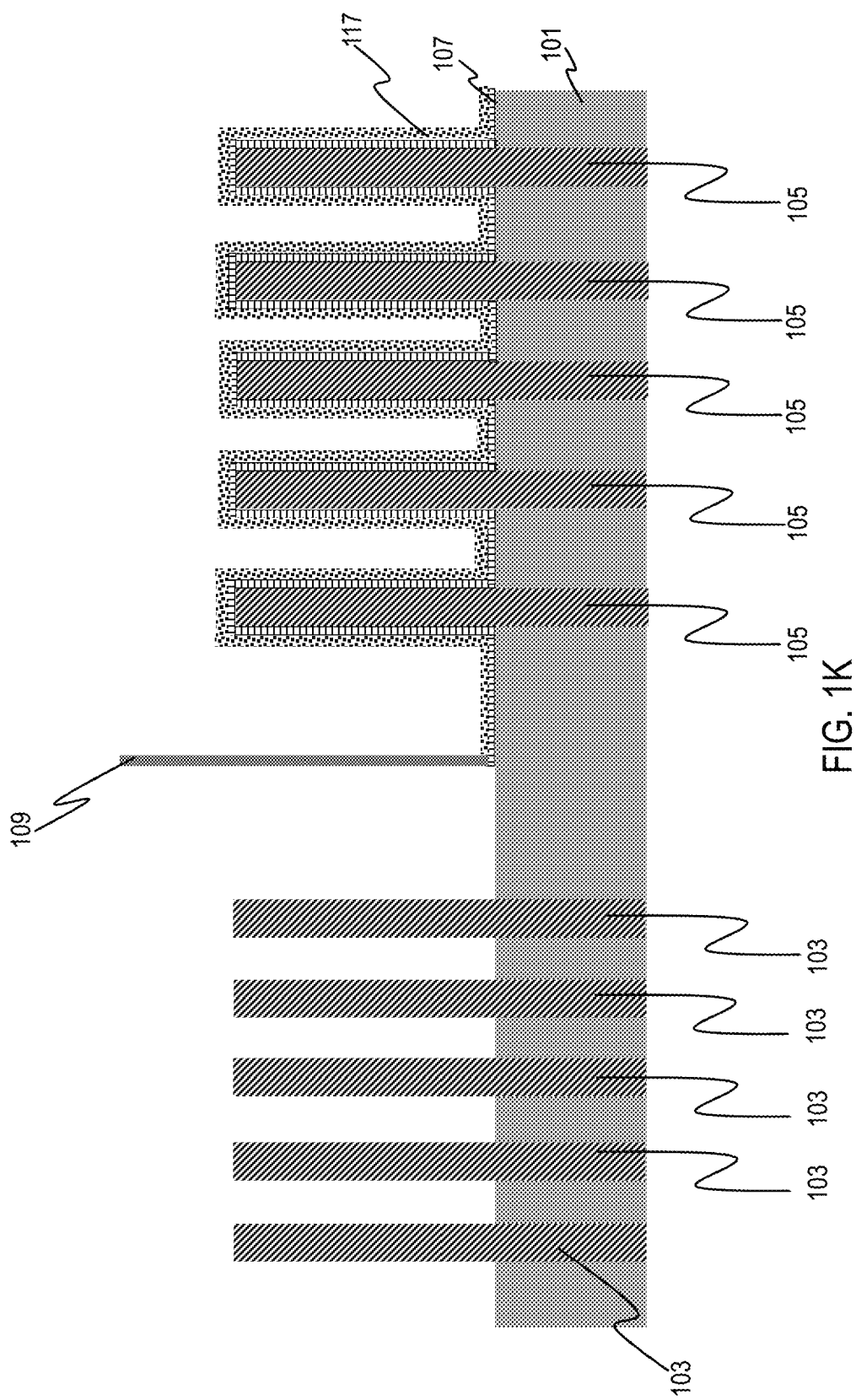

US 9,691,664 B1

DUAL THICK EG OXIDE INTEGRATION UNDER AGGRESSIVE SG FIN PITCH

TECHNICAL FIELD

The present disclosure relates to the manufacture of semiconductor devices, such as integrated circuits (ICs). The present disclosure is particularly applicable to forming both I/O device (EG) regions and core device (SG) regions on the same substrate, particularly for the 14 nanometer (nm) technology node and beyond.

BACKGROUND

EG devices require a thick silicon dioxide ($SiO_2$) layer as a gate oxide to pass the standard reliability requirements. On the other hand, SG devices, which have a smaller fin pitch, require a thinner oxide layer to prevent the oxide from pinching off, which affects polysilicon gate reactive ion etching (PC RIE) and source/drain epitaxial (epi) growth. Currently a 3 nanometer (nm) oxide layer is being used for both EG and SG devices, since a 5 nm oxide, for example, pinches off in a 27 nm SG fin. However, the 3 nm oxide is insufficient for the EG devices.

A need therefore exists for a methodology enabling formation of a thick conformal EG oxide with a thin SG oxide and the resulting device.

SUMMARY

An aspect of the present disclosure is a method for forming a thicker $SiO_2$ layer over the fins in the EG region and a thinner oxide layer over the fins in the SG region.

Another aspect of the present disclosure is a method for having a thicker $SiO_2$ layer over the fins in the EG region and a thinner oxide layer over the fins in the SG region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first set of fins over a first portion of a silicon (Si) substrate; forming a second set of fins over a second portion of the Si substrate spaced from the first portion; forming an iRAD $SiO_2$ layer over the first and second sets of fins; forming a polysilicon layer over the iRAD $SiO_2$ layer over the first set of fins; forming a radical $SiO_2$ layer over the iRAD $SiO_2$ layer over the second set of fins and over the polysilicon layer; forming a mask over the radical $SiO_2$ layer over the second set of fins; removing the polysilicon layer; and removing the mask and the iRAD $SiO_2$ layer from the first set of fins.

Aspects of the present disclosure include forming the polysilicon layer over the first set of fins by: forming a polysilicon layer over the first and second sets of fins; forming an optical planarization layer (OPL) and a silicon oxynitride (SiON) based anti reflective coating (SiARC) over the first set of fins; removing the polysilicon from the second set of fins; and removing the OPL and SiARC.

Another aspect includes forming the radical $SiO_2$ layer by low temperature radical oxidation. Further aspects include forming the mask by: forming an OPL over the hardmask and the radical $SiO_2$; forming a SiARC over the second set of fins; and removing the OPL from the first set of fins. Other aspects include removing the radical $SiO_2$ from the first set of fins prior to removing the polysilicon layer. Additional aspects include removing the radical $SiO_2$ by a buffered oxide etch (BOE). Another aspect includes the first set of fins having a pitch smaller than a pitch of the second set of fins. Further aspects include forming the iRAD $SiO_2$ layer to a thickness of 3 nm to 10 nm. Other aspects include forming the radical $SiO_2$ layer to a thickness of 3 nm to 10 nm.

A further aspect of the present disclosure is a device including: a first set of fins over a first portion of a Si substrate; a second set of fins over a second portion of the Si substrate, the second set of fins having a larger pitch than the first set of fins; an iRAD $SiO_2$ layer over the second set of fins; and a radical $SiO_2$ layer over the iRAD $SiO_2$ layer over the second set of fins.

Another aspect of the device includes the iRAD $SiO_2$ layer having a thickness of 3 nm to 10 nm. Further aspects include the radical $SiO_2$ layer having a thickness of 3 nm to 10 nm.

Another aspect of the present disclosure is a method including: forming a first set of fins over a first portion of a Si substrate; forming a second set of fins over a second portion of the Si substrate separated from the first set of fins; forming an iRAD $SiO_2$ layer over the first and second sets of fins; forming a polysilicon layer over the iRAD $SiO_2$ layer over the first set of fins; forming a radical $SiO_2$ layer over the iRAD $SiO_2$ layer over the second set of fins and over the polysilicon layer; forming an OPL over the radical $SiO_2$ layer over the second set of fins, to a height less than a height of the polysilicon layer; removing the polysilicon layer; and removing the OPL.

Aspects include forming the OPL to height less than a height of the polysilicon by: coating an OPL over the first and second sets of fins to a height above the height of the polysilicon; and removing the OPL over the first set of fins and concurrently recessing the OPL over the second set of fins to a height below the height of the polysilicon. Another aspect includes forming the polysilicon layer over the first set of fins by: forming a polysilicon layer over the first and second sets of fins; forming an OPL and a SiON based SiARC over the first set of fins; removing the polysilicon from the second set of fins; and removing the OPL and SiARC. Other aspects include forming the radical $SiO_2$ layer by low temperature radical oxidation. Further aspects include removing the radical $SiO_2$ from the first set of fins prior to removing the polysilicon layer by a BOE. Additional aspects include the first set of fins having a pitch smaller than a pitch of the second set of fins. Further aspects include forming the iRAD $SiO_2$ layer to a thickness of 3 nm to 10 nm. Another aspect includes forming the radical $SiO_2$ layer to a thickness of 3 nm to 10 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1K schematically illustrates sequential steps of a method for forming a thicker oxide layer over fins in an EG region than over fins in an SG region, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of either gate oxide pinching off for the SG region or gate oxide being too thin for the EG region attendant upon forming a single oxide for both the SG region and the EG region. In accordance with embodiments of the present disclosure an iRAD $SiO_2$ layer and a radical $SiO_2$ layer are formed over the EG region while blocking the SG region to increase the oxide thickness in only the EG region.

Methodology in accordance with embodiments of the present disclosure includes forming a first set of fins over a first portion of a Si substrate. Then, a second set of fins is formed over a second portion of the Si substrate spaced from the first portion. Next, an iRAD $SiO_2$ layer is formed over the first and second sets of fins. Subsequently, a polysilicon layer is formed over the iRAD $SiO_2$ layer over the first set of fins. Then, a radical $SiO_2$ layer is formed over the iRAD $SiO_2$ layer over the second set of fins and over the polysilicon layer. A mask is formed over the radical $SiO_2$ layer over the second set of fins. Thereafter, the polysilicon layer is removed. Next, the mask and the iRAD $SiO_2$ layer are removed from the first set of fins.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
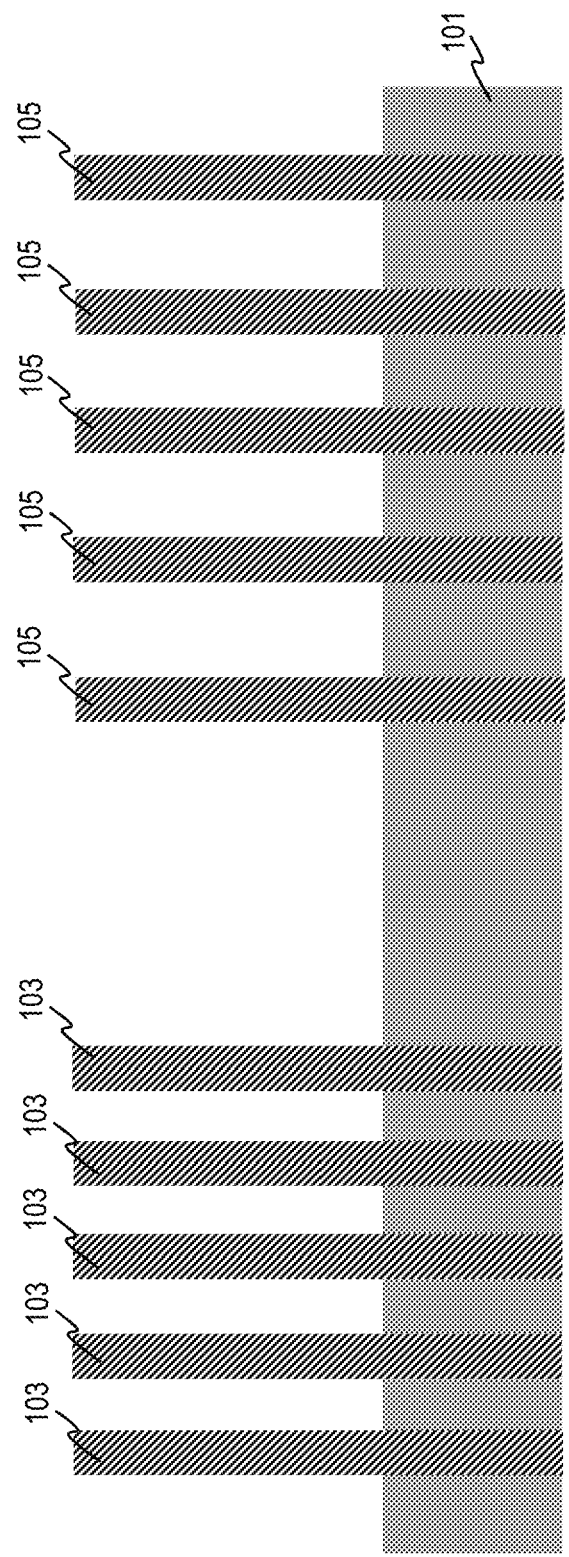
Figure 1B:
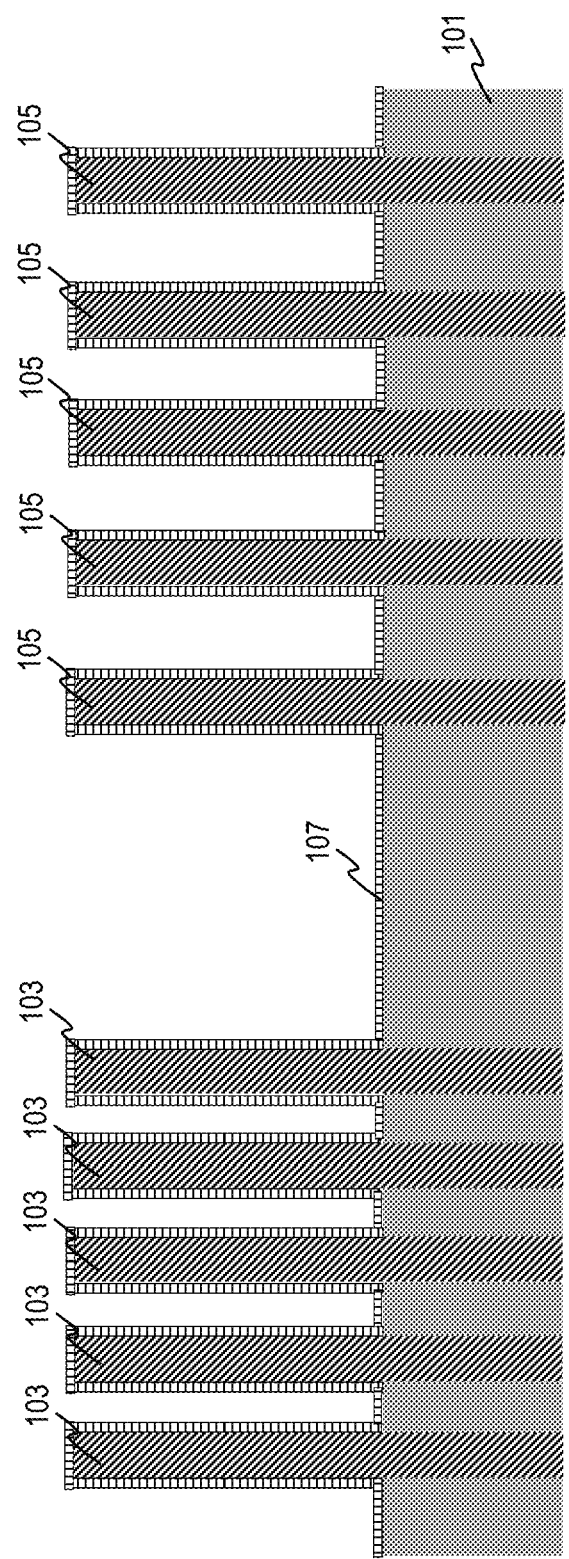
Figure 1C:
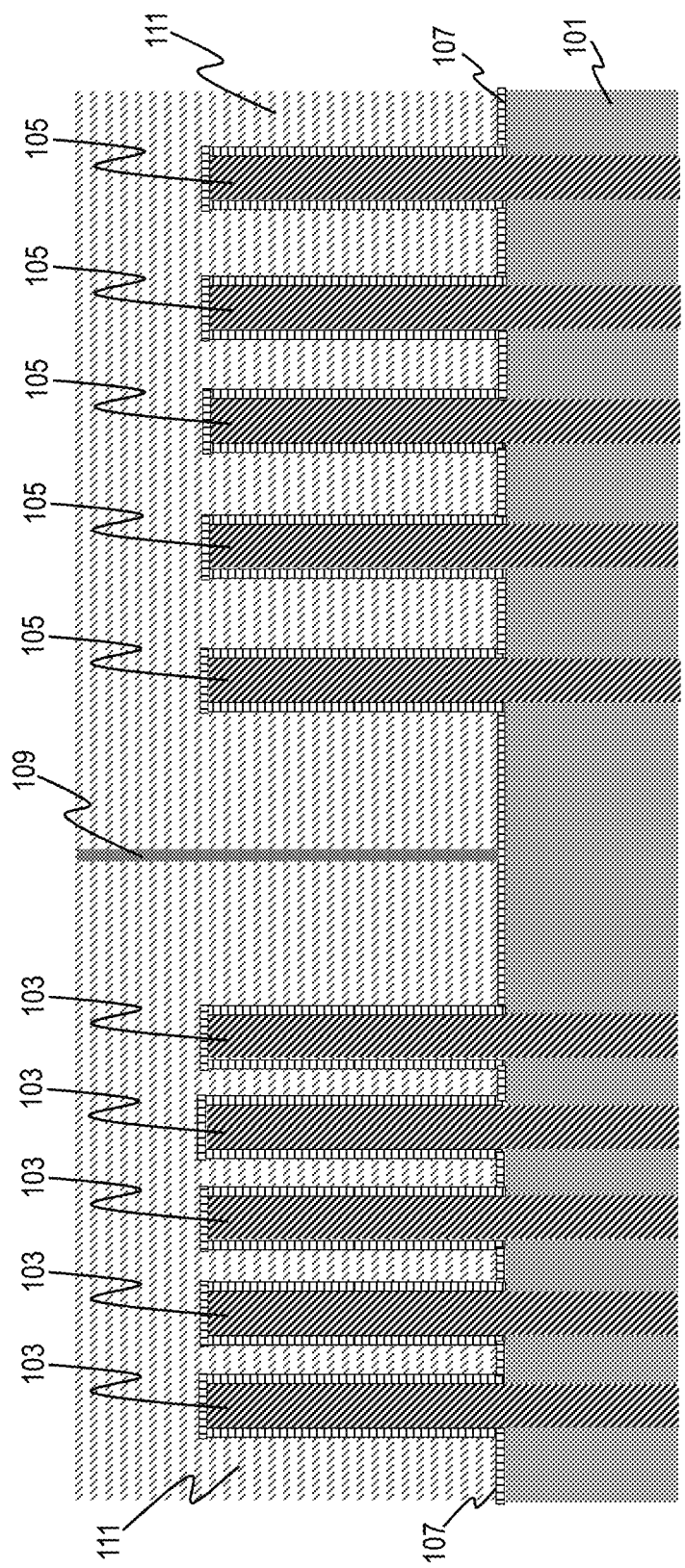
Figure 1D:
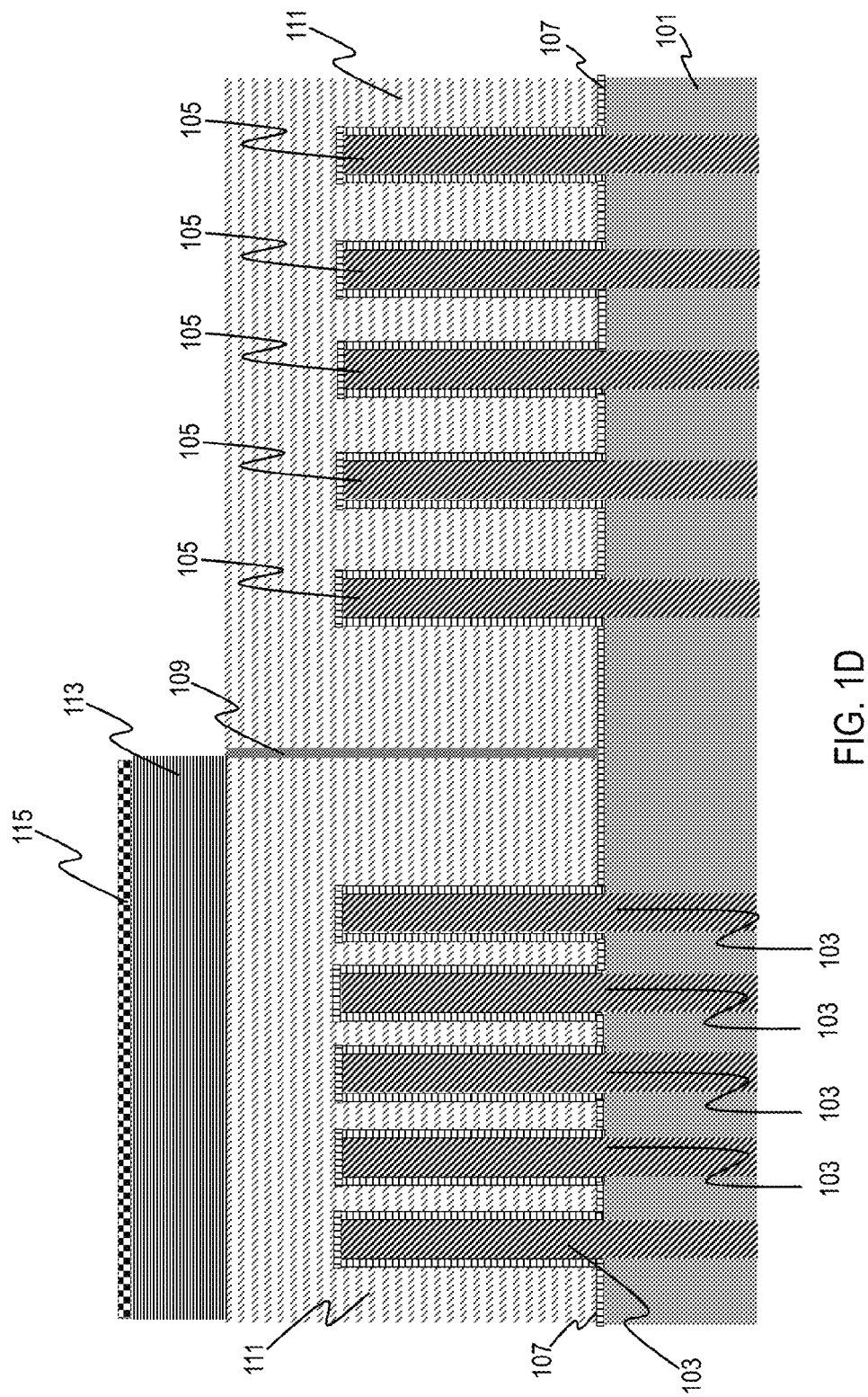
Figure 1E:
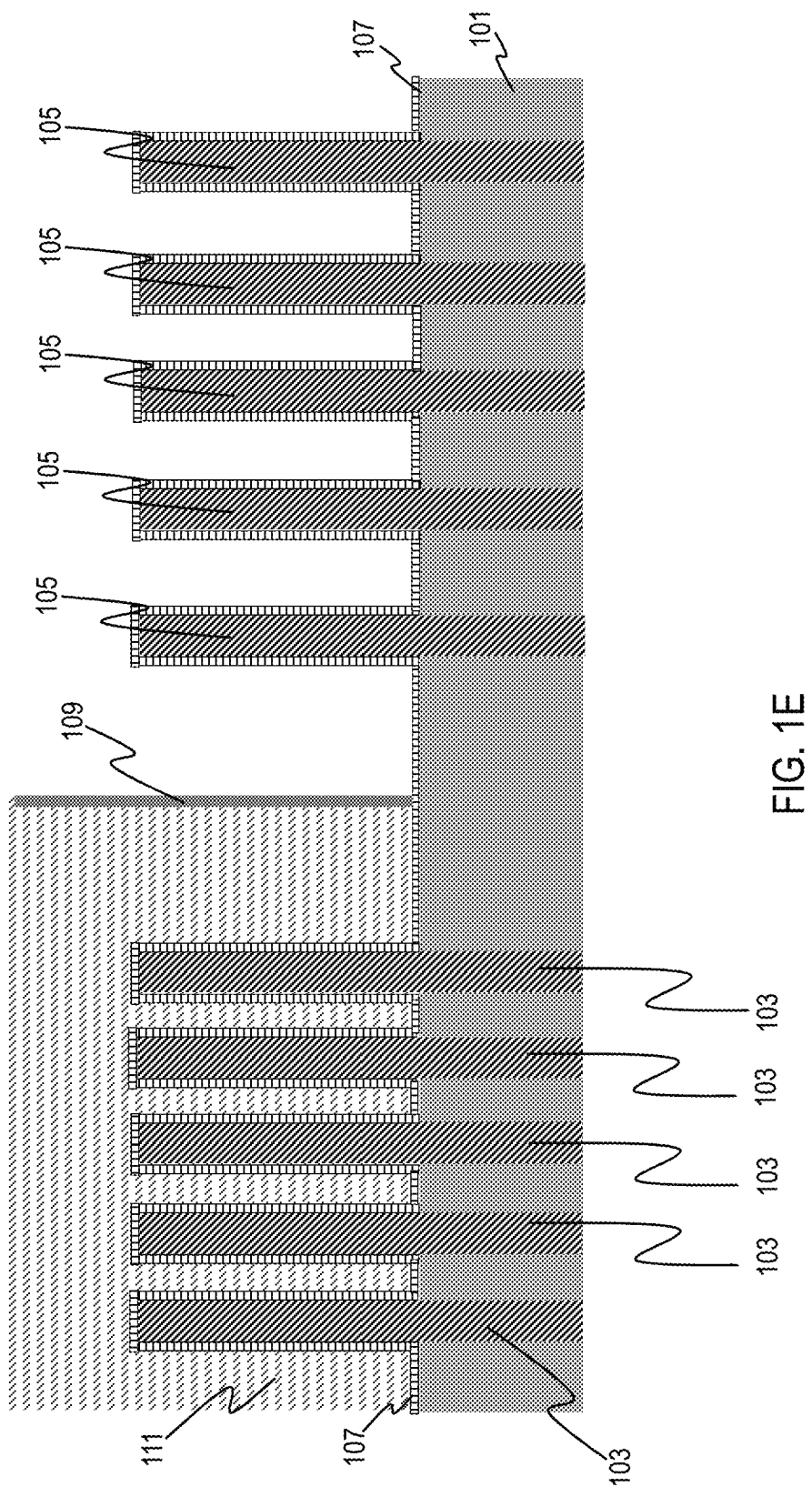

FIGS. 1A through 1K schematically illustrate sequential steps of a method for forming a thicker oxide layer over fins in an EG region than over fins in an SG region, in accordance with an exemplary embodiment. Adverting to FIG. 1A, a first set of fins 103 is formed over the SG region of a Si substrate with $SiO_2$ formed between the fins and recessed to a thickness of 50 nm to 100 nm to reveal the fins. A second set of fins 105 is formed over the EG region of the Si substrate also with $SiO_2$ formed between the fins and recessed to reveal the fins. The pitch of the SG fins 103 is smaller than the pitch of the EG fins 105. For example, the pitch of SG fins 103 may be 25 to 35 nm, whereas the pitch of EG fins 105 may be 35 to 50 nm. In FIG. 1B, an iRAD $SiO_2$ layer 107 is deposited by atomic layer deposition (ALD) over the SG fins 103, the EG fins 105, and the $SiO_2$ layer 101 to a thickness of 3 nm to 10 nm. In FIG. 1C, a separation layer 109 is illustrated between the SG fins 103 and the EG fins 105. The separation layer may be formed of silicon nitride (SiN) or $SiO_2$. The separation can be skipped when gate of the SG region is not shared with the EG region. and A polysilicon layer 111 (a dummy gate) is formed over the iRAD $SiO_2$ layer 107 between a pair of SiN or SiBCN spacers (not shown for illustrative convenience) and planarized by chemical mechanical planarization (CMP). Adverting to FIG. 1D, an OPL 113 is formed over the polysilicon layer 111 over the SG fins 103, and a SiARC layer 115 is formed over the OPL 113. As illustrated in FIG. 1E, the polysilicon layer 111 is removed from between the spacers over EG fins 105 by wet etching or hydrochloric acid (HCl) etching. Next, the SiARC layer 115 is removed by wet etching or HCL etching. Then, the OPL 113 is removed by wet etching or HCL etching.

Figure 1F:
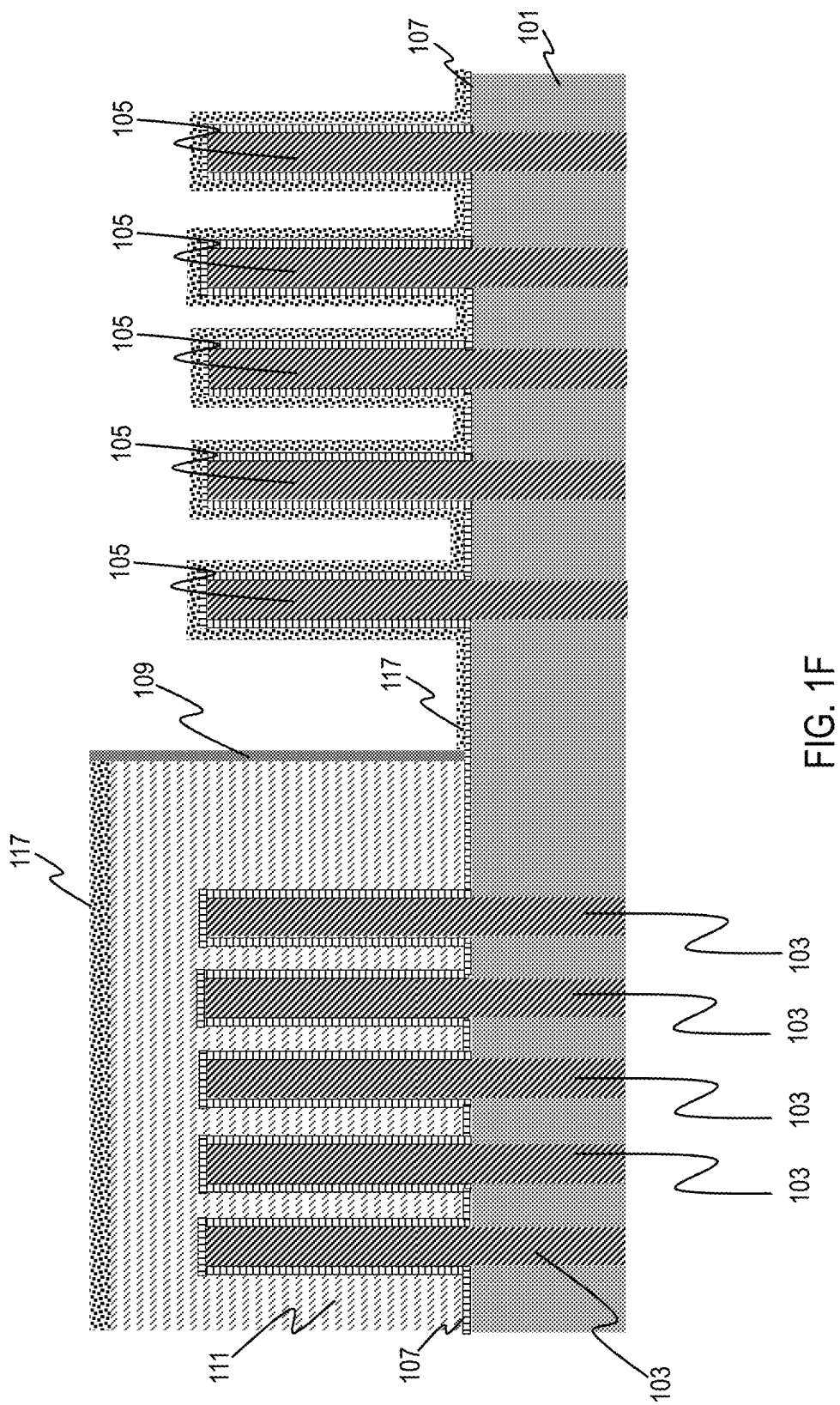
Figure 1G:
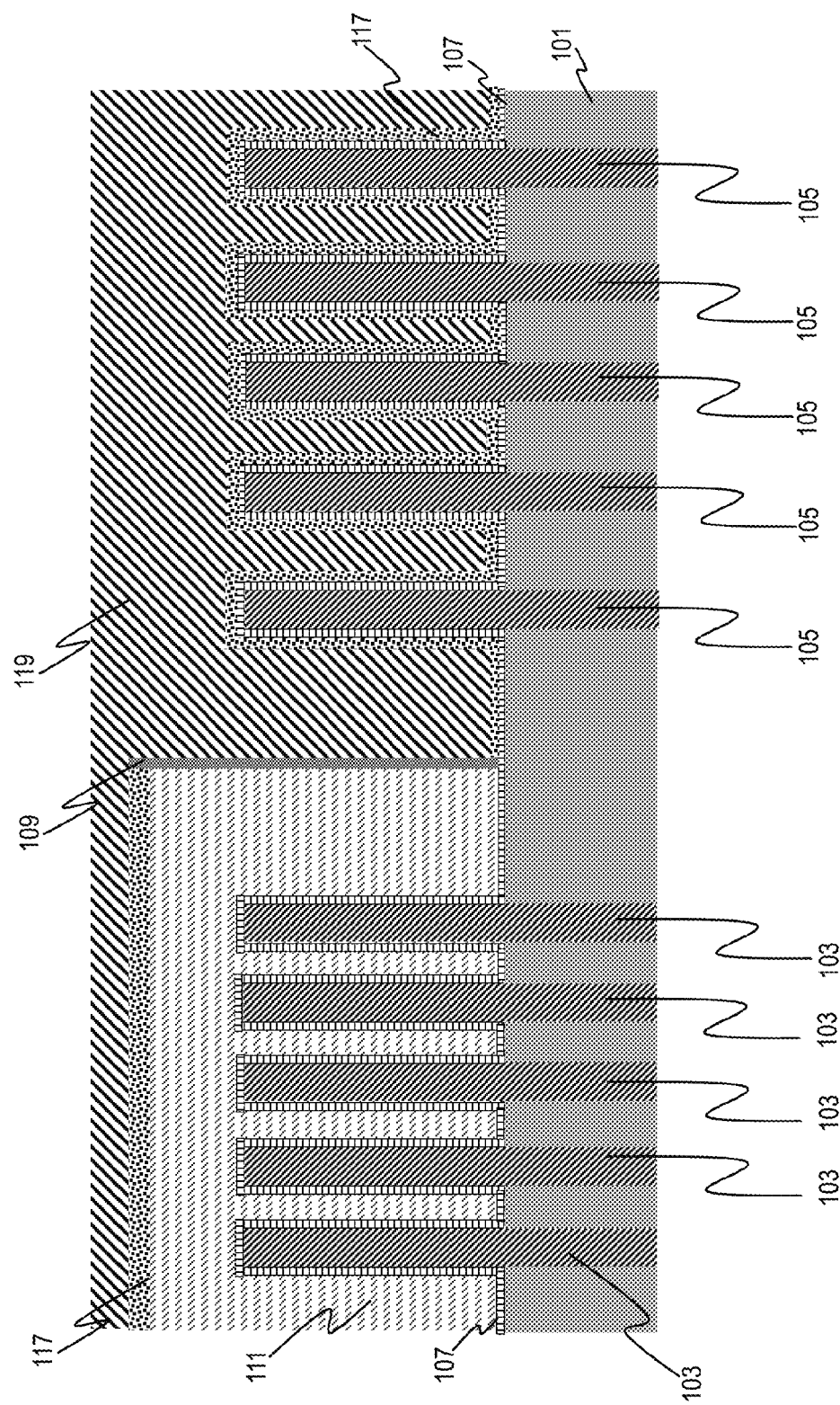
Figure 1H:
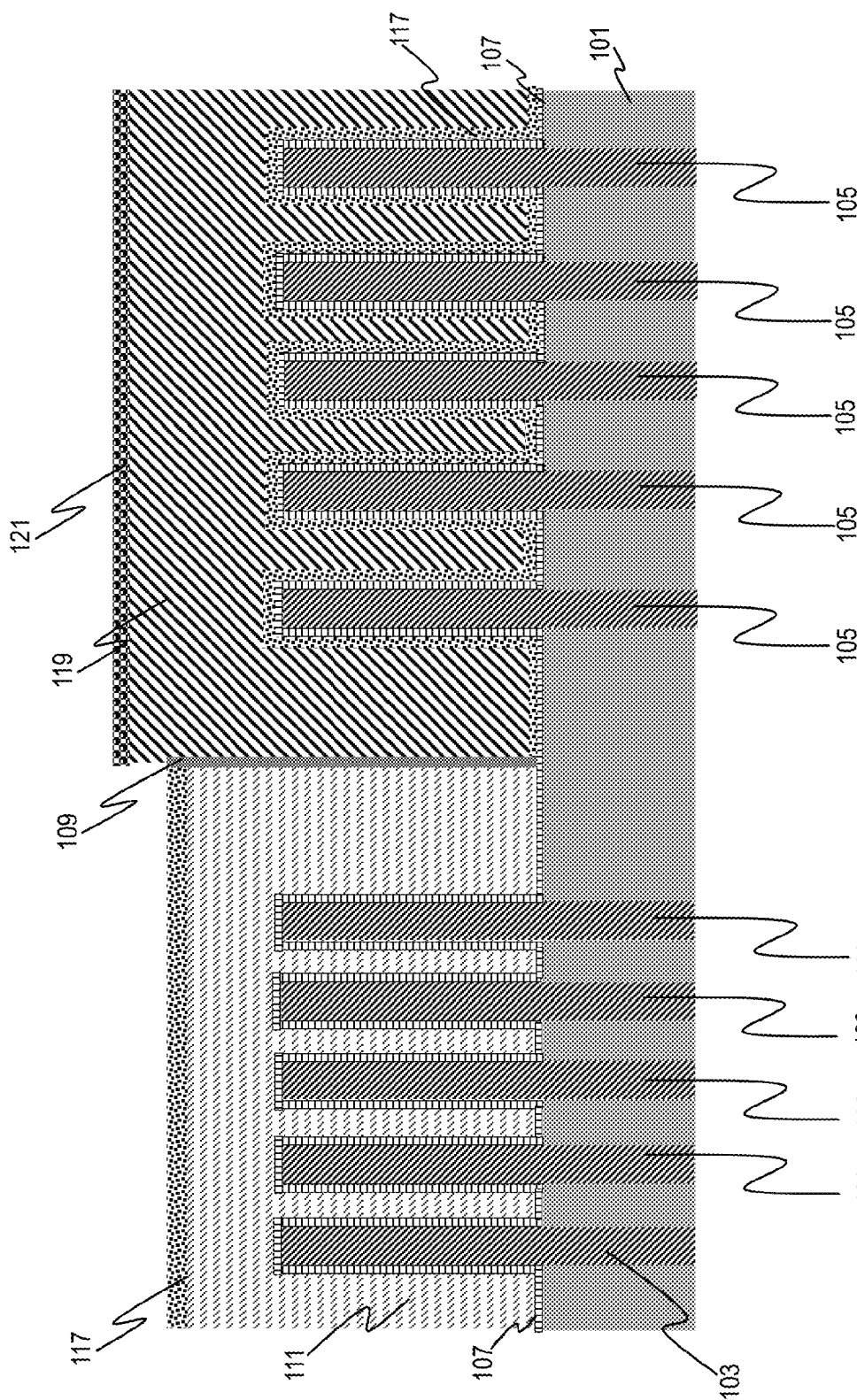
Figure 1I:
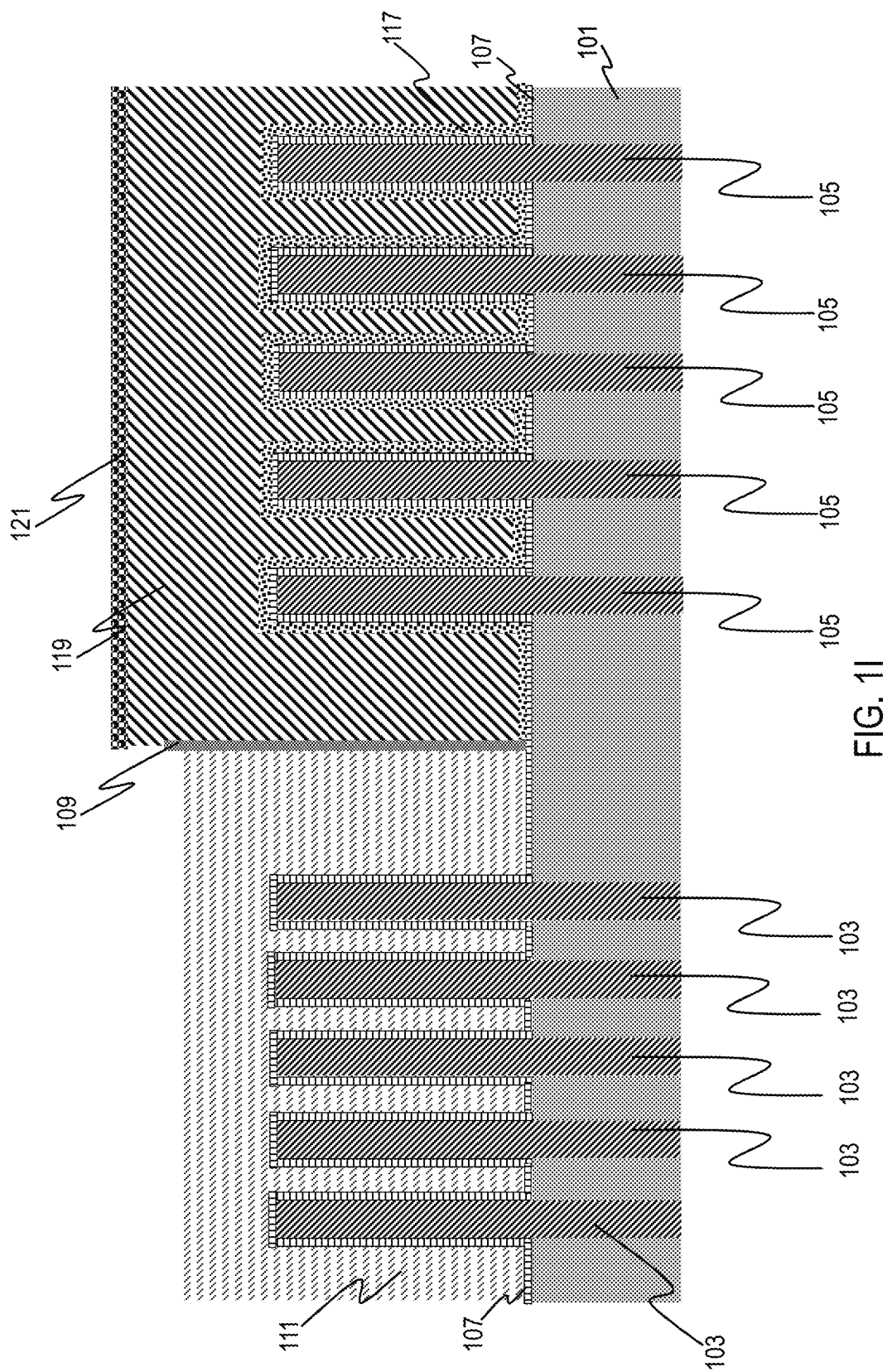
Figure 1J:
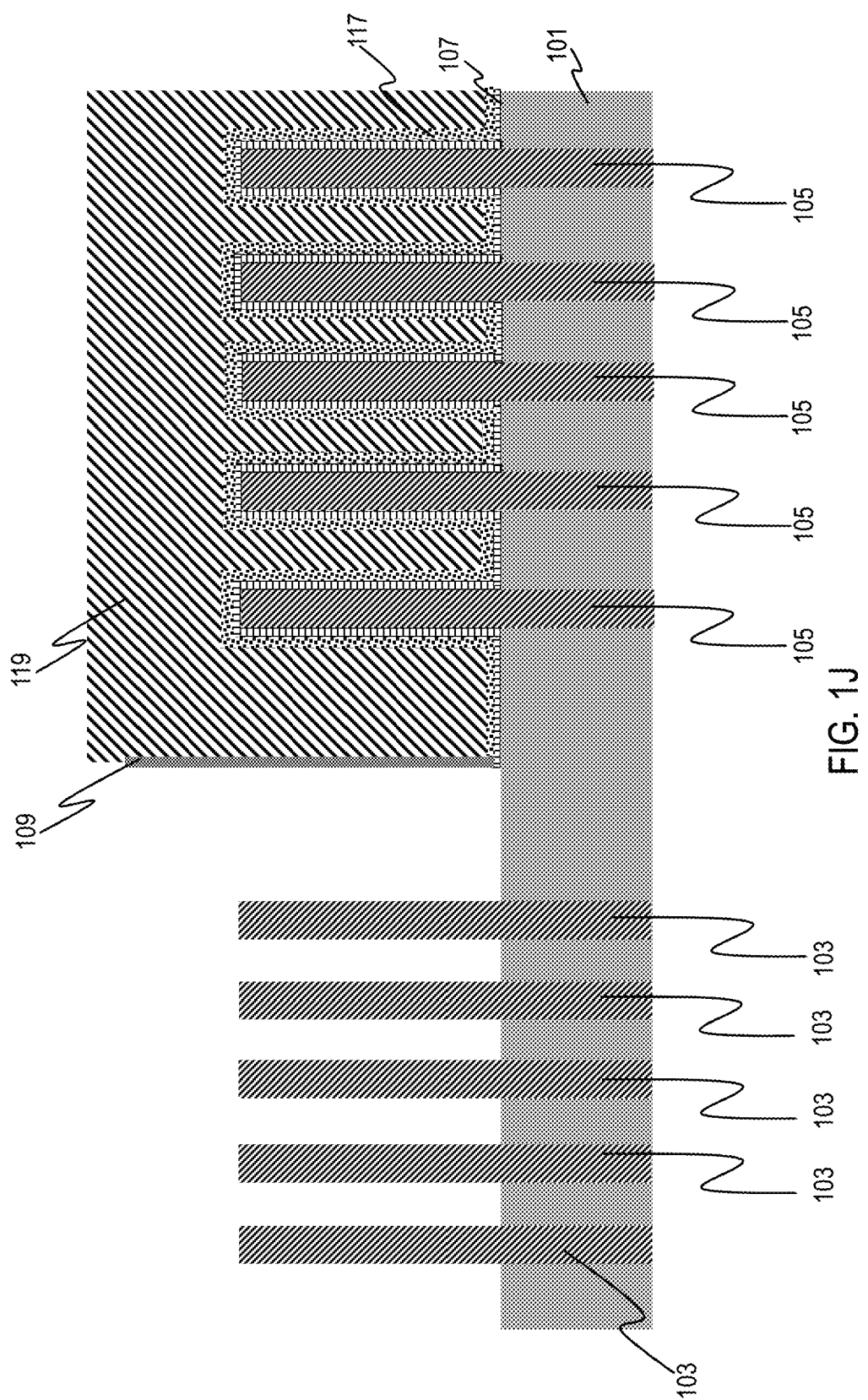

Adverting to FIG. 1F, a conformal radical $SiO_2$ layer 117 is formed by low temperature radical oxidation over the polysilicon layer 111 and the iRAD $SiO_2$ layer 107 to a thickness of 3 nm to 10 nm. In FIG. 1G, an OPL 119 is formed over the radical $SiO_2$ layer 117 and etched back for planarization. Adverting to FIG. 1H, a SiARC layer 121 is formed over the OPL 119 over the EG fins 105, e.g. to a thickness of 20 to 50 nm. Then, the OPL 119 over the SG fins 103 is removed by dry etching. In FIG. 1I, the radical $SiO_2$ layer 117 is removed from the SG fins 103 by BOE. The BOE includes a 6:1 volume ratio of 40% ammonium fluoride ($NH_4F$) in water to 49% HF in water. As illustrated in FIG. 1J, the polysilicon layer 111 is removed by wet etching or HCL etching, followed by the iRAD $SiO_2$ layer 107 over the SG fins 103 being removed by dry etching or hydrofluoric acid (HF) etching. Next, the SiARC layer 121 is removed. Adverting to FIG. 1K, the remaining OPL 119 is removed by RIE. The separation layer 109 can be removed by selective wet etching, and a thin gate oxide (such as hafnium oxide ($HfO_2$)) can be deposited on the SG region. Since the EG pitch is larger than the SG pitch, there is no pinch off with the additional gate oxide, therefore making it possible to have a thinner gate oxide (such as $HfO_2$) on the SG region and a thicker $SiO_2$ gate oxide on the EG region.

FIGS. 2A through 2E schematically illustrate sequential steps of a method for forming a thicker oxide layer over fins in an EG region than over fins in an SG region, in accordance with another exemplary embodiment. The embodiment illustrated in FIGS. 2A through 2E begins the same as the first embodiment through FIG. 1G. Specifically, a first set of fins 203 for the SG region and a second set of fins 205 for the EG region are formed over a Si substrate with a $SiO_2$ layer 201 recessed in between to reveal the fins. The pitch of the SG fins 203 is smaller than the pitch of the EG fins 205. An iRAD $SiO_2$ layer 207 is formed over the SG fins 203, the EG fins 205, and the $SiO_2$ layer 201. As illustrated, a separation layer 209 isolates the SG fins 203 from the EG fins 205. A polysilicon layer 211 is formed over the iRAD $SiO_2$ layer 207. Subsequently, an OPL and SiARC layer (not shown for illustrative convenience) are formed over the polysilicon layer 211 over the SG fins 203. Next, the polysilicon layer 211 is removed from the EG fins 205 by wet etching or HCL etching, and the SiARC layer and the OPL are also removed by wet etching or HCL etching. A radical $SiO_2$ layer 217 is formed over the polysilicon layer 211 and the iRAD SiO₂ layer 207, and an OPL 219 is formed over the radical SiO₂ layer 217 and etched back for planarization.

Figure 2A:
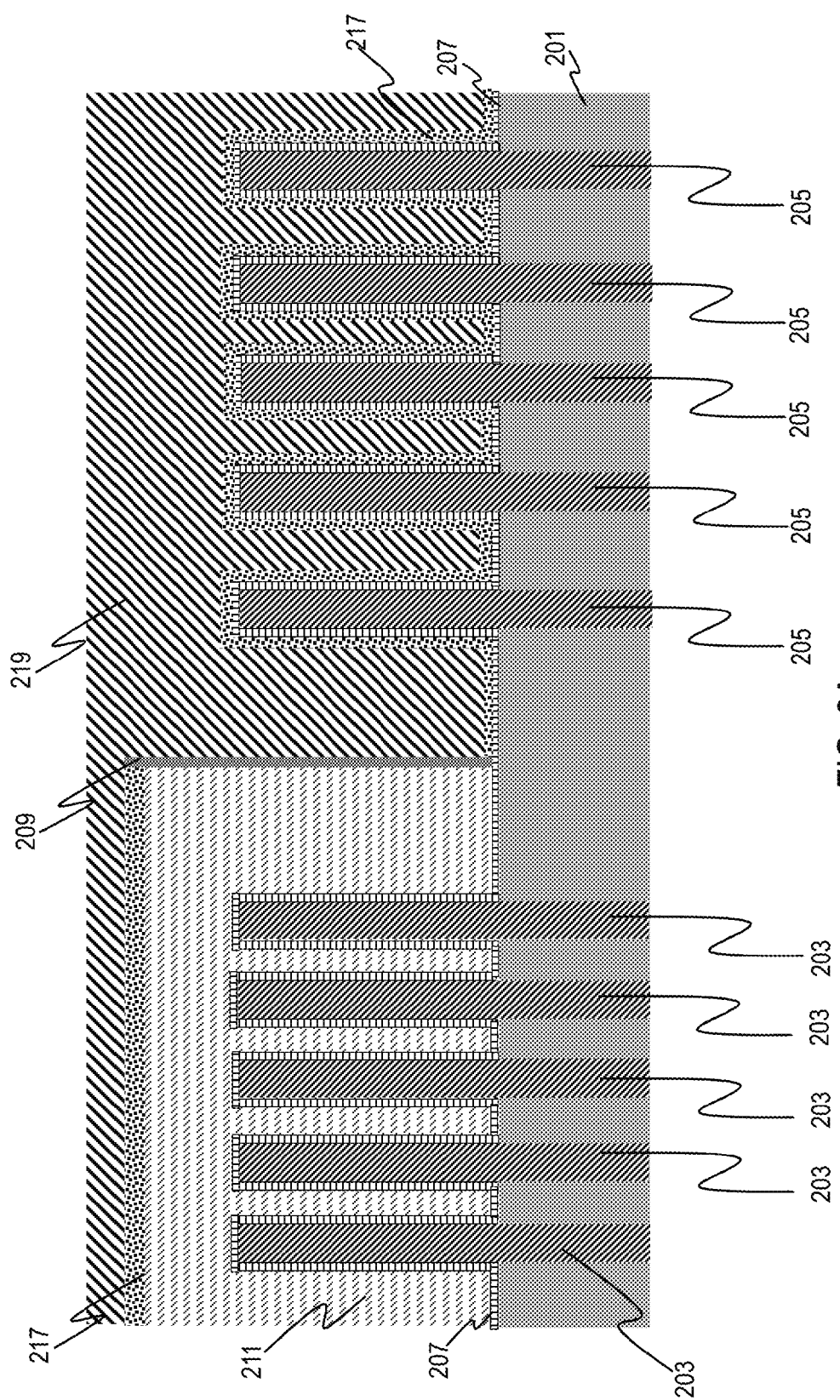
FIGS. 2A through 2E schematically illustrate sequential steps of a method for forming a thicker oxide layer over fins in an EG region than over fins in an SG region, in accordance with an exemplary embodiment.
Figure 2B:
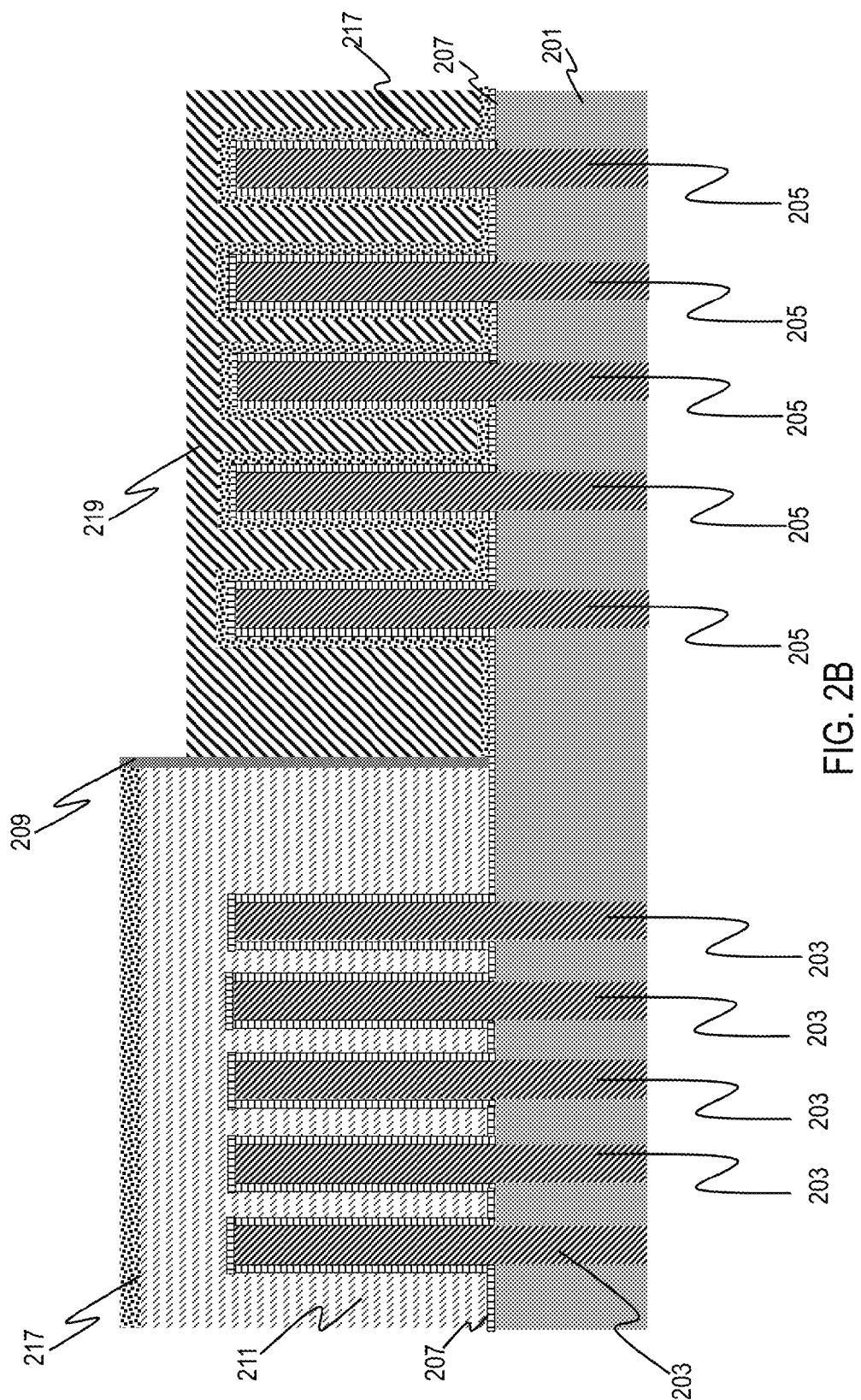
Figure 2C:
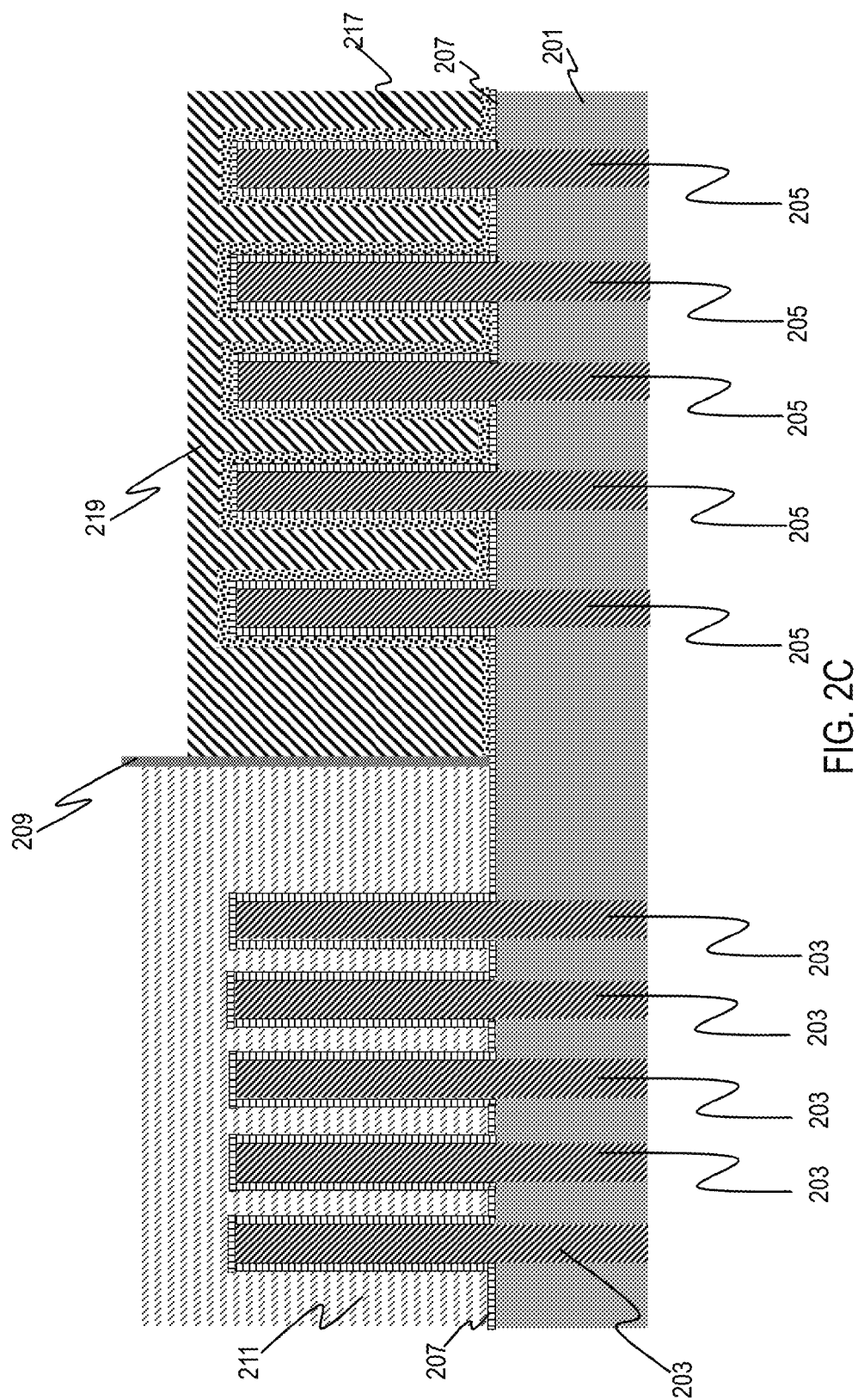
Figure 2D:
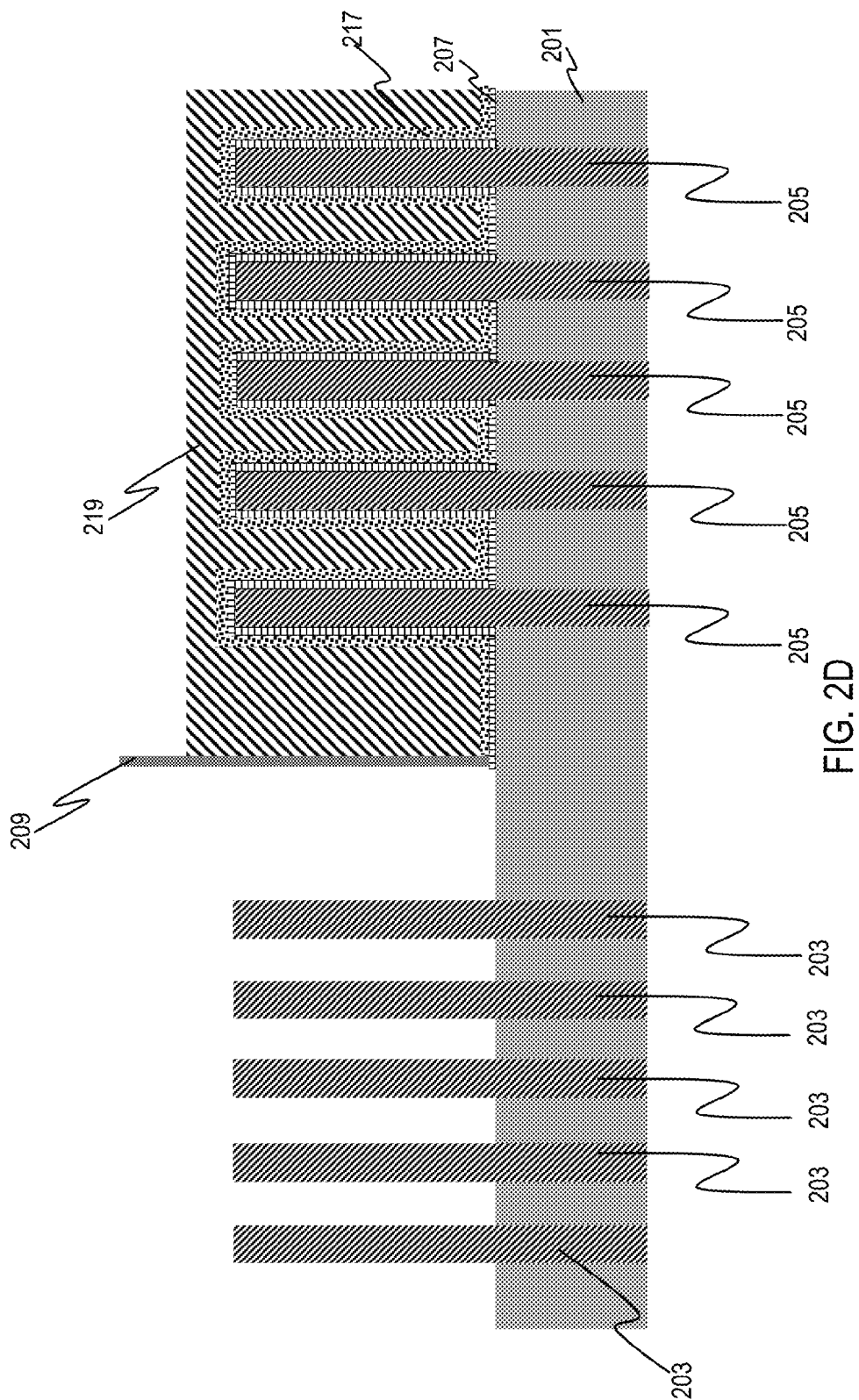
Figure 2E:
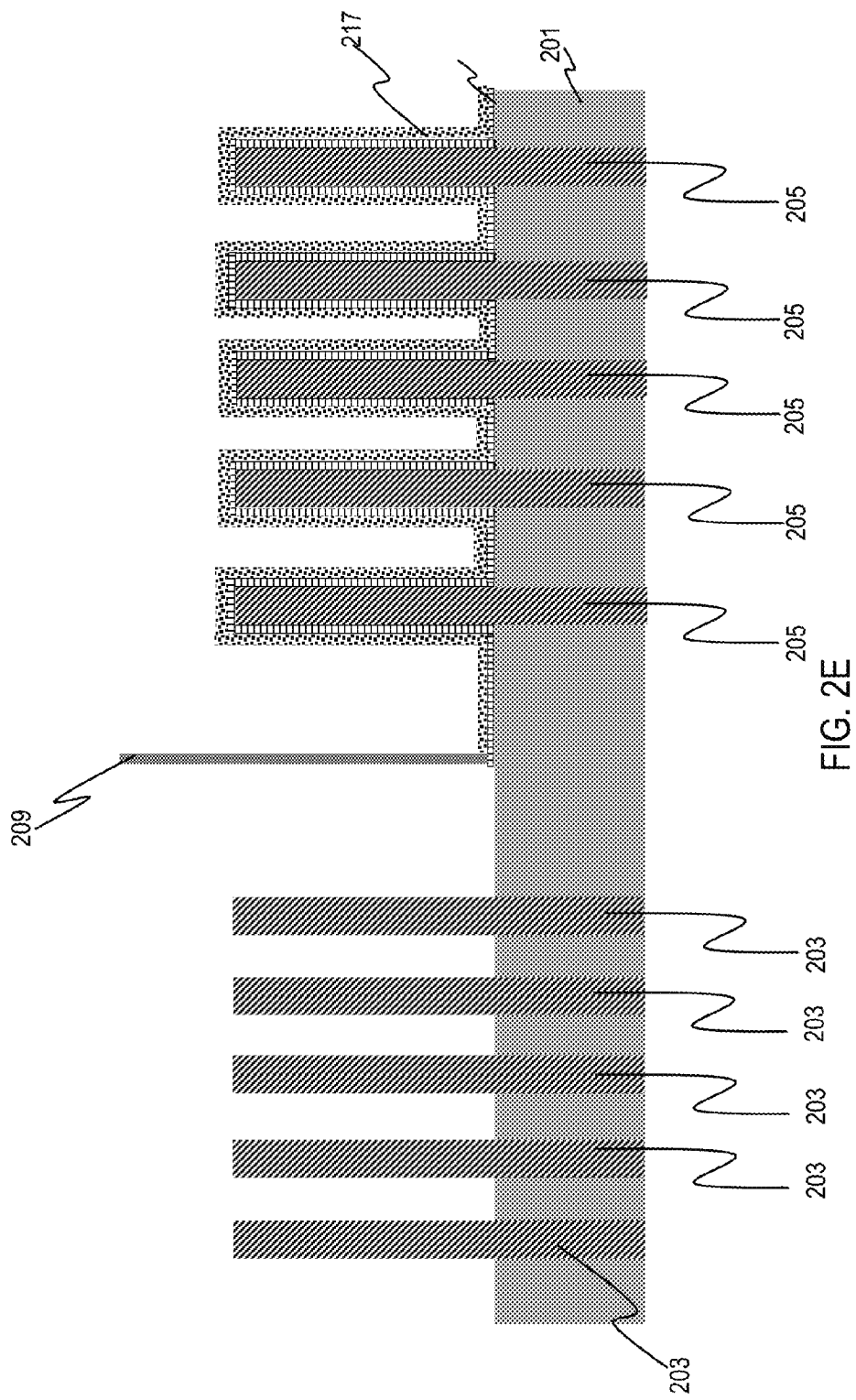

As illustrated in FIG. 2B, the OPL over the SG fins 203 is removed, and the OPL 219 over the EG fins 205 is recessed to a level below an upper surface of the polysilicon layer 211 by dry etching, e.g. RIE. In FIG. 2C, the radical SiO₂ layer 217 over the polysilicon layer 211 is removed by BOE. Then, in FIG. 2D, the remaining polysilicon layer 211 is removed by wet etching or HCL etching. The iRAD SiO₂ layer 207 over the SG fins 203 is removed by dry etching or HF etching. Last, as illustrated in FIG. 2E, the remaining OPL 219 is removed by RIE. The separation layer 209 can be removed by selective wet etching, and a thin gate oxide (such as HfO₂) can be deposited on the SG region. Since the EG pitch is larger than the SG pitch, there is no pinch off with the additional gate oxide, therefore making it possible to have a thinner gate oxide (such as HfO₂) on the SG region and a thicker SiO₂ gate oxide on the EG region.

The embodiments of the present disclosure can achieve several technical effects, such as, preventing oxide from pinching off in the SG region while increasing gate oxide on the EG region, and conformal oxide formation. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated finFET semiconductor devices, particularly for the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first set of fins over a first portion of a silicon (Si) substrate;
   forming a second set of fins over a second portion of the Si substrate spaced from the first portion;
   forming an iRAD silicon dioxide (SiO₂) layer over the first and second sets of fins;
   forming a polysilicon layer over the iRAD SiO₂ layer over the first set of fins;
   forming a radical SiO₂ layer over the iRAD SiO₂ layer over the second set of fins and over the polysilicon layer;
   forming a mask over the radical SiO₂ layer over the second set of fins;
   removing the polysilicon layer; and
   removing the mask and the iRAD SiO₂ layer from the first set of fins.

2. The method according to claim 1, comprising forming the polysilicon layer over the first set of fins by:
   forming a polysilicon layer over the first and second sets of fins;
   forming an optical planarization layer (OPL) and a silicon oxynitride (SiON) based anti reflective coating (SiARC) over the first set of fins;
   removing the polysilicon from the second set of fins; and
   removing the OPL and SiARC.

3. The method according to claim 1, comprising forming the radical SiO₂ layer by low temperature radical oxidation.

4. The method according to claim 1, comprising forming the mask by:
   forming an OPL over the hardmask and the radical SiO₂;
   forming a SiARC over the second set of fins; and
   removing the OPL from the first set of fins.

5. The method according to claim 1, comprising removing the radical SiO₂ from the first set of fins prior to removing the polysilicon layer.

6. The method according to claim 5, comprising removing the radical SiO₂ by a buffered oxide etch (BOE).

7. The method according to claim 1, wherein a pitch of the first set of fins is smaller than a pitch of the second set of fins.

8. The method according to claim 1, comprising forming the IRAD SiO₂ layer to a thickness of 3 nanometer (nm) to 10 nm.

9. The method according to claim 8, comprising forming the radical SiO₂ layer to a thickness of 3 nm to 10 nm.

10. A method comprising:
    forming a first set of fins over a first portion of a silicon (Si) substrate;
    forming a second set of fins over a second portion of the Si substrate separated from the first set of fins;
    forming an iRAD silicon dioxide (SiO₂) layer over the first and second sets of fins;
    forming a polysilicon layer over the iRAD SiO₂ layer over the first set of fins;
    forming a radical SiO₂ layer over the iRAD SiO₂ layer over the second set of fins and over the polysilicon layer;
    forming an optical planarization layer (OPL) over the radical SiO₂ layer over the second set of fins, to a height less than a height of the polysilicon layer;
    removing the polysilicon layer; and
    removing the OPL.

11. The method according to claim 10, further comprising forming the OPL to height less than a height of the polysilicon by:
    coating an OPL over the first and second sets of fins to a height above the height of the polysilicon; and
    removing the OPL over the first set of fins and concurrently recessing the OPL over the second set of fins to a height below the height of the polysilicon.

12. The method according to claim 10, comprising forming the polysilicon layer over the first set of fins by:
    forming a polysilicon layer over the first and second sets of fins;
    forming an OPL and a silicon oxynitride (SiON) based anti reflective coating (SiARC) over the first set of fins;
    removing the polysilicon from the second set of fins; and
    removing the OPL and SiARC.

13. The method according to claim 10, comprising forming the radical SiO₂ layer by low temperature radical oxidation.

14. The method according to claim 10, comprising removing the radical SiO₂ from the first set of fins prior to removing the polysilicon layer by a buffered oxide etch (BOE).

15. The method according to claim 10, wherein a pitch of the first set of fins is smaller than a pitch of the second set of fins.

16. The method according to claim 10, comprising forming the IRAD SiO$_2$ layer to a thickness of 3 nanometer (nm) to 10 nm.

17. The method according to claim 16, comprising forming the radical SiO$_2$ layer to a thickness of 3 nm to 10 nm.

* * * * *